(12) United States Patent
Li et al.

(10) Patent No.: US 9,252,367 B2
(45) Date of Patent: Feb. 2, 2016

(54) GRAPHENE DERIVATIVES, TRANSPARENT CONDUCTIVE FILMS, ORGANIC ELECTROLUMINESCENT DEVICES, METHODS OF PREPARING THE GRAPHENE DERIVATIVES AND METHODS OF PREPARING ANODE LAYERS OF THE DEVICES

(71) Applicant: BOE Technology Group Co., Ltd., Beijing (CN)

(72) Inventors: Na Li, Beijing (CN); Joohyeon Lee, Beijing (CN); Pilseok Kim, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 73 days.

(21) Appl. No.: 14/091,587

(22) Filed: Nov. 27, 2013

(65) Prior Publication Data

US 2014/0145170 A1  May 29, 2014

(30) Foreign Application Priority Data

Nov. 29, 2012 (CN) .......................... 2012 1 0500713

(51) Int. Cl.
  *C01B 31/04* (2006.01)
  *H01L 51/00* (2006.01)
  *H05B 33/28* (2006.01)
  *H01L 51/52* (2006.01)

(52) U.S. Cl.
  CPC ........ *H01L 51/0045* (2013.01); *C01B 31/0438* (2013.01); *C01B 31/0484* (2013.01); *H05B 33/28* (2013.01); *C01P 2004/04* (2013.01); *H01L 51/5203* (2013.01)

(58) Field of Classification Search
  CPC .................................................. C01B 31/0438
  See application file for complete search history.

(56) References Cited

U.S. PATENT DOCUMENTS 7,842,271 B2 * 11/2010 Petrik ........................... 423/414

FOREIGN PATENT DOCUMENTS

| CN | 102702740 A | 10/2012 |
| DE | 10 2012 104 496 A | 11/2012 |
| EP | 2 495 246 A | 9/2012 |
| JP | 2007-129170 A | 5/2007 |
| JP | 2007-296593 A | 11/2007 |

OTHER PUBLICATIONS

Roberts 'Basic Principles of Organic Chemistry' 2nd Edition p. 1329-1331 W.A. Benjamin, Inc. 1977.*

Bose, Saswata et al.: "Dual role of glycine as a chemical functionalizer and a reducing agent in the preparation of grapheme: an environmentally friendly method", *J. Mater. Chem.*, 2012, 22, pp. 9696-9703.

Li, Zhi et al.: "Triphenylamine-functionalized grapheme decorated with Pt nanoparticles and its application in photocatalytic hydrogen prodiction", *International Journal of Hydrogen Energy*, 37 (2012) pp. 1880-1888.

Georgakilas, Vasilios: "Chemical Functionalization of Ultrathin Carbon Nanosheets", *Fullerenes, Nanotubes and Carbon Nanostructures*, 18, 2010, pp. 1-9.

Nakanishi, Takashi et al.: "Fullerene nanowires on graphite: Epitaxial self-organizations of a fullerene bearing double long-aliphatic chains", *Colloids and Surfaces A: Physiochem. Eng. Aspects*, 321, 2008 pp. 99-105.

Li, Yong-Xi et al.: "The Chemistry and Potential Applications of Graphenes", *Journal of Shanghai Second Polytechnic University*, vol. 27, No. 4, Dec. 2010, pp. 259-271, in Chinese with English abstract.

Nakanishi, Takashi et al.: "Perfectly Straight Nanowires of Fullerenes Bearing Long Alkyl Chains on Graphite", *J.Am.Chem.Soc.*, 2006, 128, pp. 6328-6329.

Office action and search report from Chinese Patent Office for priority application 201210500713.5 dated Apr. 30, 2014.

Extended search report from European Patent Office for corresponding application 13192309.6 dated May 15, 2014.

* cited by examiner

*Primary Examiner* — Stuart Hendrickson
(74) *Attorney, Agent, or Firm* — Frommer Lawrence & Haug LLP

(57) ABSTRACT

The present invention belongs to the technical field of transparent conductive films and provides a graphene derivative, a transparent conductive film and an organic electroluminescent (EL) device. Methods are also provided for preparation of the graphene derivative and for preparation of an anode of the organic EL device. The graphene derivative exhibits a lower evaporation temperature and a higher work function. The graphene derivative is represented by formula (I):

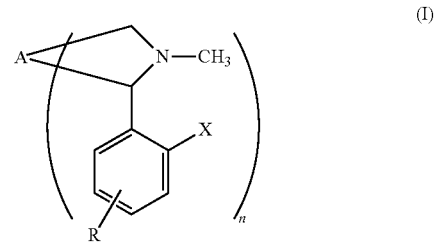

wherein A represents a graphene substrate, n represents the number of the group connected to adjacent two carbon atoms of a carbon ring of the graphene substrate; each X independently represents an electron-withdrawing group; and each R independently represents any one of $-R_1$, $-R_2$, $-O-R_1$, $-O-R_2$, $-R_1-C_6H_5$, $-R_2-C_6H_5$, and $-R_3$, wherein each $R_1$ is independently an n-alkyl group having no less than 5 carbon atoms, each $R_2$ is independently a substituted n-alkyl group having no less than 5 carbon atoms in its main chain and having an alkyl substituent, the $C_6H_5$ represents a phenyl group which is connected to the end of $R_1$ or $R_2$, and $R_3$ is an aryl group.

14 Claims, 2 Drawing Sheets

GRAPHENE DERIVATIVES, TRANSPARENT CONDUCTIVE FILMS, ORGANIC ELECTROLUMINESCENT DEVICES, METHODS OF PREPARING THE GRAPHENE DERIVATIVES AND METHODS OF PREPARING ANODE LAYERS OF THE DEVICES

FIELD OF THE INVENTION

The present invention relates to the technical field of transparent conductive films. More particularly, the present invention relates to graphene derivatives, transparent conductive films, organic electroluminescent (EL) devices, methods of preparing the graphene derivatives and methods of preparing anode layers of the organic EL devices.

BACKGROUND OF THE INVENTION

Transparent conductive films have been widely used in various applications, for example, as film electrodes in radio frequency identification tags, display devices, lighting devices, electronic paper, solar cells, transistors, integrated circuits, lasers, sensors, and so on. Currently, the most popular materials for preparing transparent conductive films are metal oxides, such as indium tin oxide (ITO), indium zinc oxide (IZO) and the like. However, such metal oxides are brittle and also expensive due to high content of rare metals, resulting in that the applications thereof are greatly limited.

Apart from the above-said brittle films made of metal oxides, there is another kind of flexible transparent conductive films in the art. The flexible transparent conductive films have broader applications because they are flexible and bendable, as compared with metal oxide conductive films. Particularly, the flexible transparent conductive films are suitable for use in flexible organic electroluminescent devices (OLEDs). The materials for making the flexible transparent conductive films known in the art are mainly conductive polymers and carbon nanotubes. Traditional conductive polymers including, for example, polyaniline (PANI) and polypyrrole (PPy), are poor in conductivity. So, other conductive polymers have been developed, including, for example, poly(3,4-ethylenedioxythiophene monomer:polystyrene sulfonate) (i.e., PEDOT:PSS), which have good conductivity but are expensive. The carbon nanotubes have excellent photoelectric and mechanical properties. However, techniques of preparing and purifying the carbon nanotubes are complex and it is difficult to separate semi-conductive carbon nanotubes from the metallic carbon nanotubes, resulting in that they are hardly industrially used on a large scale.

Graphene is a two-dimensional sheet comprising a monolayer of graphite, wherein carbon atoms are in $sp^2$ hybridization mode (like a benzene ring) and form a honeycomb-like hexagonal lattice, as shown in FIGS. 1 and 2. The carbon atoms 1 at the edge of the graphene sheet may adsorb other atoms 2 (e.g., hydrogen atom) to satisfy its valence. With such a structure, graphene is not only very stable, but also flexible upon exposure to an applied force because the bonds between the carbon atoms thereof are flexible. It has been found that graphene is not only stretchable like a rubber, but also stronger than a diamond. Furthermore, graphene exhibits an electrical conductivity comparable to copper. The electrical conductivity of graphene is so stable that it is not affected even when being stretched (or bent) by a ratio of over 40%. In addition, graphene products of large size can be produced practically and cost-effectively by the well-established techniques such as chemical vapor deposition, chemical reduction and the like.

Due to the excellent properties as described above, graphene is a promising material for flexible transparent conductive films. However, some defects have been found in the existing graphene materials. First of all, the evaporation temperatures of the graphene materials are relatively high (about 400° C.), such that it is difficult to control the evaporation process to obtain a graphene film with a uniform thickness (currently, the film is often formed by vapor deposition). In addition, the graphene materials have a relatively low work function of about 4.4 eV (the term "work function" refers to the minimum energy required to move an electron inside an object to its surface, indicating its ability to bind up electrons). In contrast, flexible OLEDs usually require the organic substances used therein to have a work function of about 5.2 eV, which is substantially higher than the work function of the graphene materials. Such a mismatch makes hole-injection difficult to take place and causes the luminescence efficiency of the OLEDs to decrease.

SUMMARY OF THE INVENTION

One object of the present invention is to provide a graphene derivative exhibiting a lower evaporation temperature and a higher work function, in order to overcome the above-mentioned defects of the existing graphene materials having higher evaporation temperatures and lower work functions.

The object is achieved by a graphene derivative represented by the following formula (I) (also shown in FIG. 5):

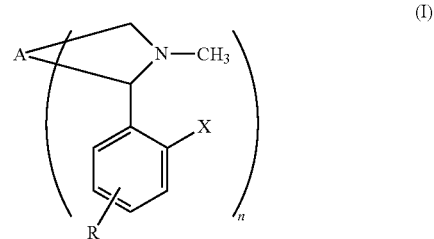

wherein:
A represents a graphene substrate;
n represents the number of the group represented by the following formula (II) and is a positive integer equal to or less than a half (½) of the total number of carbon atoms in the graphene substrate:

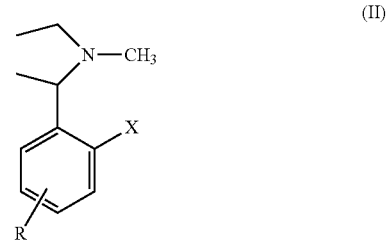

wherein each group represented by formula (II) is connected to adjacent two carbon atoms of a carbon ring of the graphene substrate, and each carbon atom of the graphene substrate connects with at most one group represented by formula (II);

each X independently represents an electron-withdrawing group (e.g., —NO$_2$ or —CN); and each R independently represents any one of —R$_1$, —R$_2$, —O—R$_1$, —O—R$_2$, —R$_1$—C$_6$H$_5$, —R$_2$—C$_6$H$_5$, and —R$_3$, wherein each R$_1$ is independently an n-alkyl group having no less than 5 carbon atoms, each R$_2$ is independently a substituted n-alkyl group having no less than 5 carbon atoms in its main chain and having alkyl substituent(s), the C$_6$H$_5$ represents a phenyl group which is connected to the end of R$_1$ or R$_2$, and R$_3$ is an aryl group.

Herein, the term "alkyl" refers to a group formed by removing one hydrogen atom from a saturated hydrocarbon wherein the removed hydrogen is originally bonded to a carbon atom of the saturated hydrocarbon (e.g., the n-alkyl described with reference to the groups —R$_1$, —R$_2$, —O—R$_1$, and —O—R$_2$), or refers to a divalent linking group formed by removing 2 hydrogen atoms from a saturated hydrocarbon wherein the removed hydrogen atoms are originally bonded to different carbon atoms of the saturated hydrocarbon (e.g., the n-alkyl described with reference to —R$_1$—C$_6$H$_5$ and —R$_2$—C$_6$H$_5$).

Herein, the term "aryl" refers to a substituted or unsubstituted aromatic group which may comprise a single benzene ring or multi-benzene rings. Said multi-benzene ring refers to a carbon-ring aryl consisting of two or more benzene rings bonded at a single position via single bond or fused at two or more positions. Preferably, the aryl does not substantively impair the electron-withdrawing function of the group X. More preferably, the aryl has 6 to 24 ring carbon atoms, and examples thereof includes, but not limited to, benzene, biphenyl, terphenyl, naphthalence, anthracene, phenanthrene, pyrene, naphthacene groups, etc. The aryl may be substituted with a linear or branched alkyl, and preferably substituted with lower alkyl, e.g., C$_{104}$ alkyl, wherein the alkyl may be further substituted with a phenyl.

Herein, the term "electron-withdrawing group" refers to an atom or an atomic group which exhibits a stronger electron-withdrawing capability (i.e., electron-negativity) than a hydrogen atom. The electron-withdrawing group is preferably a nitrogen-containing group, and more preferably, —NO$_2$ or —CN.

Herein, the term "graphene substrate" refers to a sheet of graphene, as shown in FIG. 3. The above-described group represented by formula (II) can be connected to adjacent two carbon atoms of a carbon ring either at the edge of the graphene sheet (shown in FIG. 3) or at the interior of the graphene sheet (not shown). The total number of the group represented by formula (II) in a graphene derivative is n. Since each carbon atom can connect with at most one group represented by formula (II), one carbon ring of the graphene substrate can connect with at most three groups represented by formula (II). Therefore, the maximum value of n is a half of the total number of the carbon atoms of the graphene substrate (the total number is necessarily an even number (i.e., 2, 4, 6, 8, 10, 12, and so on), because the graphene substrate consists of the 6-membered carbon ring structures). The group "R" can be connected to any available position on the phenyl ring, that is to say, it can be connected to the meta-position, para-position or ortho-position (except the ortho-position occupied by

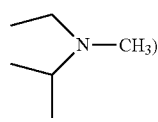

relative to the group X.

In the graphene derivatives of the present invention, the group X having electron-withdrawing function is introduced to the graphene substrate. Due to the presence of the group X, the work function of the graphene is increased to 4.6-5.2 eV which matches the work function of the organic substances. Moreover, by incorporating the relatively large group R into the graphene substrate, the evaporation temperature of the graphene derivatives reduces to 330-370° C., which facilitates the derivatives to form a film via a process of vapor deposition.

Preferably, the graphene substrate has 500-10,000 carbon atoms.

The group represented by formula (II) is preferably a group as shown by the following formula (IIa), wherein R group is connected to the para-position relative to the group

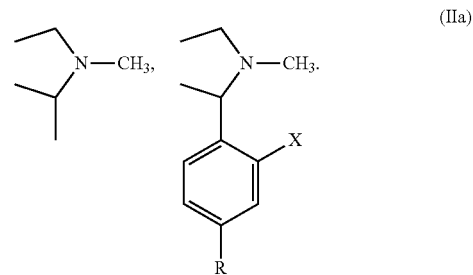

Preferably, the number of carbon atoms of said R$_1$ ranges from 5 to 20.

Preferably, the number of carbon atoms in the main chain of R$_2$ ranges from 5 to 20. The substituent(s) of R$_2$ may be linear or branched alkyl, preferably lower alkyl (e.g., C1-C4 alkyl), and more preferably, methyl or ethyl. It is also preferred that the alkyl substituent(s) of R$_2$ is/are connected to the carbon atom(s) at 2-position or 3-position of the main chain of R$_2$.

Preferably, the number of ring carbon atoms of R$_3$ ranges from 6 to 24.

Preferably, R$_3$ is any one selected from the group consisting of phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-tetracenyl, 2-tetracenyl, 9-tetracenyl, 1-pyrenyl, 2-pyrenyl, 4-pyrenyl, 2-biphenyl, 3-biphenyl, 4-biphenyl, p-terphenyl-4-yl, p-ter phenyl-3-yl, p-terphenyl-2-yl, m-terphenyl-4-yl, m-terphenyl-3-yl, m-terphenyl-2-yl, o-tolyl, m-tolyl, p-tolyl, p-tert-butyl-phenyl, p-(2-phenylpropyl)phenyl, 3-methyl-2-naphthyl, 4-methyl-1-naphthyl, 4-methyl-1-anthryl, 4'-methyl-biphenyl, and 4"-tert-butyl-p-terphenyl-4-yl.

Another object of the present invention is to provide a method of preparing a graphene derivative exhibiting a lower evaporation temperature and a higher work function, in order to overcome the defects of the existing graphene materials which have higher evaporation temperatures and lower work functions.

The object is achieved by a method of preparing a graphene derivative of the present invention, comprising the steps of:

dispersing a graphene in a solvent to form a dispersion, and then mixing the dispersion with N-methyl glycine and a substituted benzaldehyde represented by the following formula:

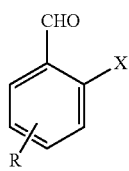

to form a reaction mixture, wherein the definitions of R and X are the same as described above with respect to the formula (I), respectively; and heating the reaction mixture to a reaction temperature and maintaining the mixture under the temperature to effect reaction, thereby obtaining the graphene derivative.

The graphene derivative prepared according to the method of the present invention exhibits a relatively low evaporation temperature and a relatively high work function, as described above.

Preferably, the graphene used in the present invention is a monolayer graphene in a powder form, and has an average particle size of from 200 to 1,000 nm. That is to say, any graphene powder product commercially available can be used as a raw material in the method of preparing the graphene derivatives. The graphene powder product is preferably a monolayer graphene (its thickness being about 0.8 nm), and the average particle size thereof is preferably from 200 to 1,000 nm. Each particle of the graphene powder is an aggregation of a plurality of graphene molecules (the number of carbon atoms in each graphene molecule is preferably between 500 and 10,000). Graphene powders are easily to be obtained since the graphene products commercially available are typically in powder forms and they are readily to react because the surface area of a powder is relatively large. Therefore, graphene powders are suitable for use in the present invention.

Preferably, the solvent is an organic solvent. It is preferably to be any one selected from the group consisting of toluene, dioxane, tetrahydrofuran, nitrobenzene, and dichloroethane.

Preferably, the molar ratio of the graphene carbon atoms, N-methyl glycine, and substituted benzaldehyde is 1: (1.5 to 5.5): (2 to 12), wherein the mole number of the carbon atoms of the graphene can be determined by the following formula:

Mole number of the carbon atoms of the graphene=the weight of the graphene (g)/mole weight of carbon atoms (12 g/mol).

More preferably, the molar ratio of the graphene carbon atoms, N-methyl glycine, and substituted benzaldehyde is 1:(2.5 to 3.5):(5 to 7).

Most preferably, the molar ratio of the graphene carbon atoms, N-methyl glycine, and substituted benzaldehyde is 1:3:6.

The preferred ratio of the carbon atoms of the graphene to be reacted with the N-methyl glycine and substituted benzaldehyde is given in the above-identified ranges.

Preferably, in the method of the present invention, the reaction mixture is heated to a temperature of 60 to 150° C., and maintained at the temperature for 8 to 20 hours.

According to the method of the present invention, after the reaction for preparing the graphene derivative is finished, it is preferred that the obtained graphene derivative is separated from the reaction mixture by a chromatography technique. The chromatography is a known technology for separating substances, which can be carried out in various ways. In the present invention, a silica gel column chromatography is preferred to be employed.

The graphene derivatives of the present invention may be used to prepare conductive films. Thus, according to one embodiment of the invention, a transparent conductive film is provided, and the film contains any of the graphene derivatives described herein.

The present invention also provides an organic EL device comprising any of the graphene derivatives as described above, so as to solve the problem that the existing graphene materials are not applicable for the organic EL device. The organic EL device of the present invention is easy to prepare, and exhibits a high light-emitting efficiency. The maximum brightness of the EL device is improved, but the turn-on voltage thereof is lowered.

The technical solution for achieving the object of the present invention is an organic EL device having an anode layer, wherein said anode layer comprises any of the graphene derivatives of the present invention as described above.

The graphene derivatives as described above can be used in the organic EL devices of the present invention. The evaporation temperature of the graphene derivatives is low and therefore it is easy to prepare the organic EL devices. The graphene derivatives also have a high work function, which can match with the work function as required by an organic EL layer. Thus, the light-emitting efficiency and maximum brightness of the organic EL device are high, and the turn-on voltage thereof is low.

Preferably, said anode layer is formed by a vacuum evaporation of the graphene derivative onto a substrate. The temperature of the vacuum evaporation ranges from 330 to 370° C.

The graphene derivatives of the present invention can be formed into flexible transparent conductive films. They can be used as film electrodes in radio frequency identification tags, display devices, lighting devices, electronic paper, solar cells, transistors, integrated circuits, lasers, sensors and etc. The graphene derivative of the present invention is particularly suitable to be formed as an electrode associated with an organic material, such as an electrode in an organic transistor, an organic integrated circuit, an organic solar cell, an organic laser, and an organic sensor. In particular, the graphene derivative of the present invention is especially suitable to be formed as an anode of an organic EL device. The organic EL device can be used in display devices, illumination devices and the like.

Figure 1:
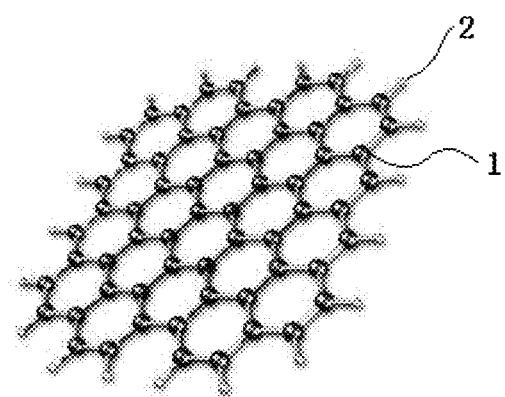
FIG. 1 is a schematic drawing showing the atom composition of a graphene.
Figure 2:
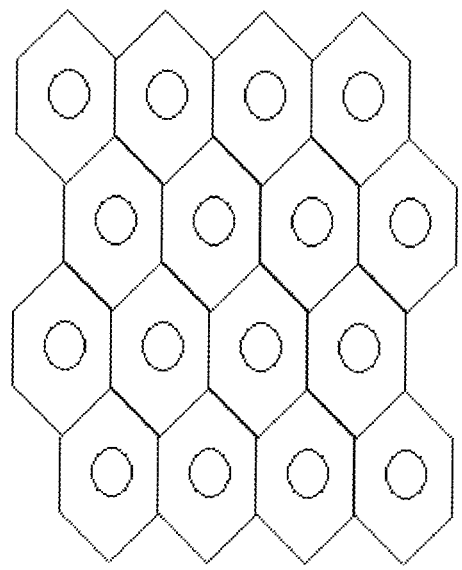
FIG. 2 is a schematic drawing showing the structure of a graphene.
Figure 3:
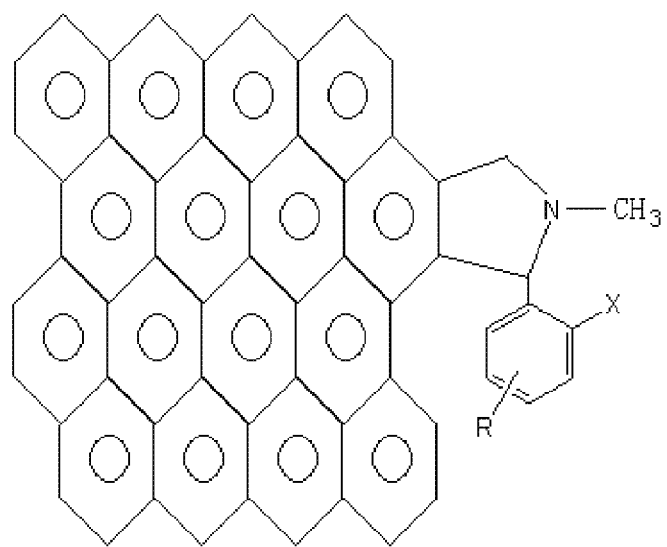
FIG. 3 is a schematic drawing showing the structure of a graphene derivative of the present invention.

REFERENCE NUMBERS AS SHOWN IN THE FIGURES ARE LISTED BELOW 1. carbon atoms;
2. atoms other than carbon atoms;
3. a substrate;
4. an anode layer;
5. a hole injection layer;
6. a hole transporting layer;

7. an organic EL layer;
8. an electronic transporting layer; and
9. an electron injection layer.

DETAILED DESCRIPTION OF CERTAIN EMBODIMENTS

Embodiments of the present invention will be described in detail with reference to the accompanying figures, so that a person skilled in the art can get a better understanding of the technical solutions of the invention.

In the following examples, the amount (i.e., the mole number) of the carbon atoms in the graphene powder is determined by the following formula:

The mole number of the carbon atoms in the graphene powder=the weight of the graphene powder (g)/the mole weight of carbon atoms (12 g/mol).

The yield of the respective graphene derivative is determined by the following formula:

The yield of the graphene derivative=[(the weight of the graphene powder as the raw material−the weight of the unreacted graphene)/the weight of the graphene powder as the raw material]×100%.

The graphene derivative prepared by each example is measured by a Raman Spectroscopy with the following experimental conditions:
Mode: wavelength mode;
Interval: 0.1 nm; and
Operation wavelength: 1400-2800 nm.

Each of the graphene derivatives prepared by the Examples exhibits characteristic peaks at the wavelengths of 1580 nm and 2700 nm, respectively, indicating that the group represented by formula (II) has been connected to the graphene substrate in every Example.

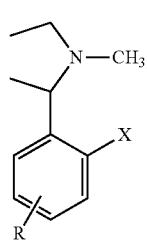
(II)

In the Examples for preparing the graphene derivatives of the present invention, the amount of the carbon atoms in the graphene substrate is determined by a DLS scattering particle size distribution analyzer (for example, by a Malvern Mastersizer). The number n of the groups represented by formula II which are connected to the graphene substrate is determined by a statistic after an observation with an Atomic Force Microscope (for example, NANO SCOPE-4 Model, DI Corporation, USA). In each of the following examples, the number n of the groups represented by formula II falls within the range of 100-300.

The organic EL devices manufactured in the respective Examples and Comparative Example have been tested according to the I-V-L standard test method, with reference to the International Standard IEC 62341-6-1 for the specific conditions and process.

The raw materials used in the respective Examples are as follows:

The graphene powders are commercially available from Sinocarbon Materials Technology Co., Ltd (Taiyuan, Shanxi Province, China). The substituted benzaldehydes are commercially available from Sinopharm Chemical Reagent Co., Ltd. (Shanghai, China). All the solvents used (including toluene, dioxane, tetrahydrofuran, nitrobenzene, and dichloroethane) and N-methy glycine are commercially available from Beijing Chem. Factory (Beijing, China). The graphene used in the Comparative Example is also available from Sinocarbon Materials Technology Co., Ltd.

Example 1

This example provides a graphene derivative having a structure shown as the following formula (I-1):

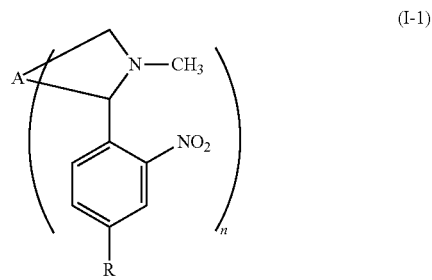
(I-1)

In the structure (I-1), A represents a graphene substrate of which the number of the carbon atoms is in the range of 500-1000, "n" represents the total number of the groups connected to the graphene substrate A, and R is n-pentyl. The group connected to the graphene substrate is represented by formula (IIa):

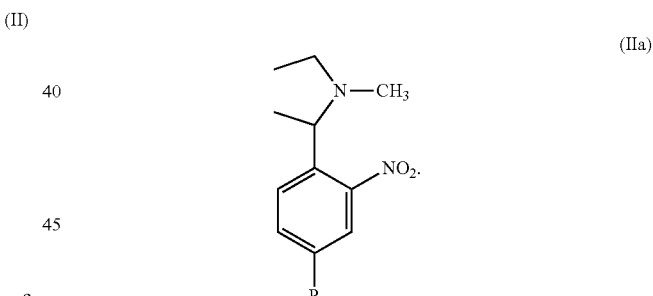
(IIa)

Each of the group represented by formula (IIa) can be connected to adjacent two carbon atoms of a carbon ring either at the edge of the graphene sheet or at the interior of the graphene sheet. Since each carbon atom can connect with at most one group represented by formula (IIa), n is a positive integer equal to or less than a half of the total number of the carbon atoms of the graphene substrate. This example also provides a method of preparing the above-mentioned graphene derivative, comprising the following steps.

A powder of monolayer graphene having a particle size of 200 nm is dispersed in toluene. N-methyl glycine and a substituted benzaldehyde are added into the dispersion to form a reaction mixture. The molar ratio of the carbon atoms of the graphene powder, N-methyl glycine and the substituted benzaldehyde is 1:3:6.

The structure of the substituted benzaldehyde is shown as below:

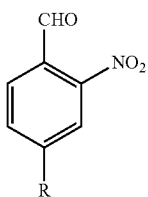

wherein R is n-pentyl.

While being magnetically stirred, the reaction mixture is heated to 60° C. in an oil bath, and maintained at the temperature for 12 h, thereby the graphene derivative of Example 1 is obtained. The reaction is as below:

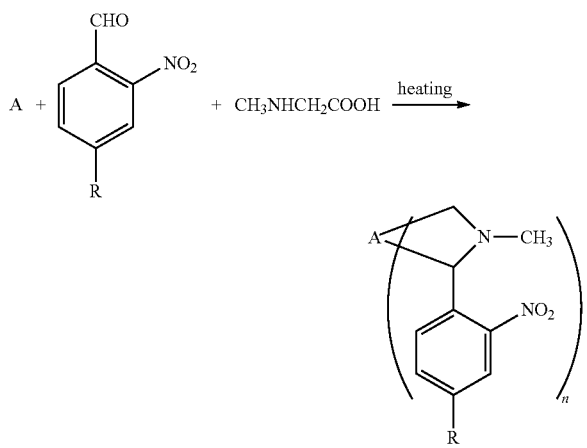

Preferably, the obtained graphene derivative is separated by chromatography. The separation process includes: removing the solvent from the reaction mixture by a rotary evaporation under a reduced pressure at 60 to 100° C.; dissolving the residue in carbon disulfide ($CS_2$) to form a solution; putting the solution onto a silica gel column; and using an eluent to wash the column, wherein the purple band of the unreacted graphene is first washed off by using $CS_2$ as the eluent, and then the brown band of the derivative product is washed off by using toluene as the eluent. The toluene solution is spin-dried at 110° C., then removed the impurities with petroleum ether, and dried in vacuum for 10 to 20 h. As a result, a dark brown solid is obtained, which is the graphene derivative product (yield: 50%).

The present example also provides an organic EL device in which the graphene derivative of the present example is used as the anode material. The organic EL device is a light emitting device, in which an anode and a cathode are arranged on or beneath the organic EL material. Thus, the organic EL device can be widely used in an OLED, an illumination device and etc. The main parts of an organic EL device include a substrate, an anode layer, an organic light emitting layer (EML), and a cathode layer.

Figure 4:
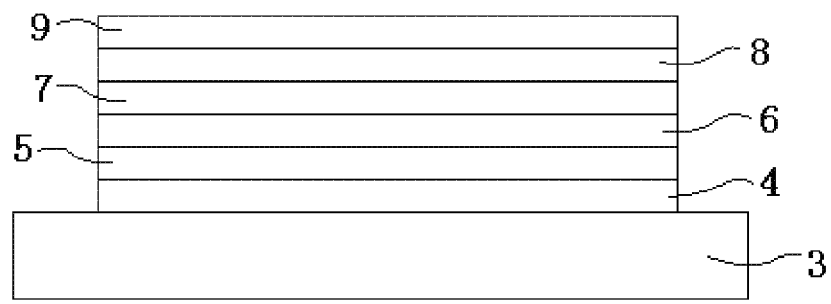
FIG. 4 is a schematic drawing showing the structure of an organic EL device of the present invention.
Figure 5:
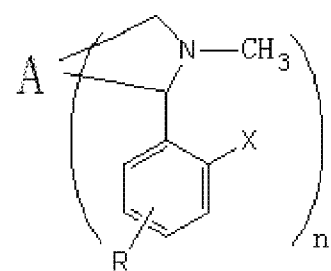
FIG. 5 shows the structural formula of a graphene derivative of the present invention.

Preferably, to enhance the transmission of the electrons and the holes, a hole injection layer (HIL) 5 and a hole transporting layer (HTL) 6 may be provided, as shown in FIG. 4, so that the anode layer 4, the HIL 5, the HTL 6 and the organic EL layer 7 are stacked in a direction from the substrate to the cathode layer (not shown). An electron transporting layer (ETL) 8 and an electron injection layer (EIL) 9 can also be provided, so that the cathode layer, the EIL 9, the ETL 8, and the organic EL layer 7 are stacked in a direction from the cathode layer to the substrate. That is to say, preferably, the organic EL device includes: a substrate 3/an anode layer 4/a hole injection layer 5/a hole transporting layer 6/an organic EL layer 7/an electron transporting layer 8/an electron injection layer 9/a cathode layer.

In addition to glass, a flexible transparent substrate may be employed as the substrate and the flexible substrate is preferred. Examples of the materials for forming the flexible substrate include, but not limited to, polyester compounds, polyimide compounds and the like. The anode layer is made from the graphene derivative of the present example (if possible and necessary, other substances may also be added into the anode layer). The hole injection layer can be made of titanium bronze (CuPc) or a star-shaped polyamine material and the like. An example of the star-shaped polyamine is 4,4',4''-tris[2-naphthyl(phenyl)amino]triphenylamine (2-TNATA). The hole transporting layer can be made of triarylamine materials and the like, such as N,N'-di-(1-naphthyl)-N,N'-diphenyl-1,1'-biphenyl-4-diamine (NPB). The organic EL layer is made of an organic EL material. A fluorescent material or a phosphorescent material can be doped in the organic EL material. Examples of the dopants include, but not limited to, 3-tertbutyl-9,10-di-(2-naphthypanthracene (MADN), 9,10-di-(2-naphthyl)anthracene (ADN), 2,5,8,11-tetra-t-butyl perylene (TBPe), 4,4-N,N-dicarbazole-biphenyl (CBP), (2-phenylpyridine)iridium (Ir(PPy)), 5,6,11,12-tetraphenyltetracene (Rubrene), 4-(dicyanomethylene)-2-t-butyl-6-(1,1,7,7-tetramethyljulolidinyl-4-vinyl)-4H-pyran (DCJTB), tris(8-hydroxyquinoline)aluminum (Alq3), tris(8-hydroxyquinoline)gallium (Gaq3), or (salicylidene-o-aminophenol)-(8-hydroxyquinoline)gallium (Ga(Saph-q)). The electron transporting layer can be a metal organic complex or a phenanthroline material and the like, such as Alq3, Gaq3, Ga(Saph-q), 4,7-diphenyl-1,10-phenanthroline (BPhen). The electron injection layer can be made of lithium fluoride (LiF) and the like. The cathode layer may be made of lithium, magnesium, calcium, strontium, aluminum, indium and other metals having a low work function, or an alloy thereof with copper, gold or silver.

The preparation process of the organic EL device of the present example is described below in detail.

A polyimide substrate is ultrasonically cleaned in a detergent, rinsed by deionized water, and followed by removing oil in a solvent mixture of acetone and ethanol under ultrasonic vibration. Thereafter, the substrate is baked to fully remove the water, and irradiated by a UV cleaner for 10 minutes, followed by bombarding the surface of the substrate with a low-energy positive ion beam.

Then, the substrate is placed in a vacuum chamber having a vacuum degree of $1 \times 10^{-5}$ to $9 \times 10^{-3}$ Pa. The graphene derivative of the present example is evaporated onto the surface of the substrate at a rate of 0.1 nm/s at a temperature of 370° C. to produce an anode layer having a thickness of 150 nm.

A hole injection layer having a thickness of 15 nm is formed, by evaporating 2-TNATA at a rate of 0.1 nm/s onto the surface of the anode layer.

A hole transporting layer having a thickness of 60 nm is formed, by evaporating NPB at a rate of 0.1 nm/s onto the hole injection layer.

An organic EL layer having a thickness of 30 nm is formed, by evaporating an organic EL material at a rate of 0.1 nm/s onto the hole transporting layer. The material of the organic EL layer is the TBPe doped with 2% MADN, i.e., TBPe:MADN (2%).

An electron transporting layer having a thickness of 30 nm is formed, by evaporating Alq3 at a rate of 0.1 nm/s onto the organic EL layer.

An electron injection layer having a thickness of 1 nm is formed, by evaporating LiF at a rate of 0.05 nm/s onto the electron transporting layer.

A cathode layer having a thickness of 100 nm is formed, by evaporating a silver-magnesium alloy at a rate of 2.5 nm/s onto the electron injection layer to produce the organic EL device, wherein the molar ratio of magnesium to silver in the alloy is 10:1. As a result, the organic EL device has a configuration of polyimide substrate/the graphene derivative of Example 1 (150 nm)/2-TNATA (15 nm)/NPB (60 nm)/TBPe:MADN (2%, 30 nm)/Alq3 (30 nm)/LiF (1 nm)/MgAg (10:1, 100 nm).

The performances of the organic EL device of Example 1 have been measured according to the I-V-L standard test method, and the results thereof are as follows:

Chromaticity coordinates: X=0.15, Y=0.22;

Maximum brightness: 10120 cd/m² (12 V);

Turn-on voltage: 4.2 V; and

Illumination efficiency: 7 cd/A.

Example 2

The present example provides a graphene derivative having a similar structure as that of Example 1. The structure of the derivative of Example 2 is as below:

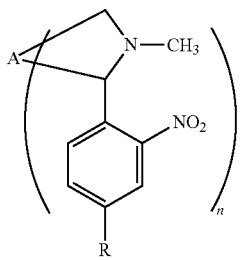
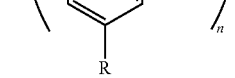

(I-1)

In the structure (I-1), A represents a graphene substrate and n is the total number of the groups connected to the graphene substrate A. The number of carbon atoms of the graphene substrate A is between 9000 and 10000, R is —O—$R_1$, and $R_1$ is n-octadecyl.

The present invention also provides a method of preparing the graphene derivative of Example 2, comprising the following steps.

In a pressure container, a powder of monolayer graphene having a particle size of 1000 nm is dispersed in dioxane. N-methyl glycine and a substituted benzaldehyde are added into the dispersion to form a reaction mixture. The molar ratio of the carbon atoms of the graphene powder, N-methyl glycine and the substituted benzaldehyde is 1:2.5:9.

The structure of the substituted benzaldehyde is shown as below:

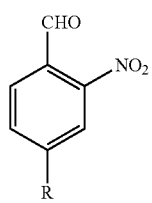

wherein R is —O—$R_1$, and $R_1$ is n-octadecyl.

While being magnetically stirred, the reaction mixture is heated under pressure to 150° C. in an oil bath, and maintained at the temperature for 10 h, thereby the graphene derivative of Example 2 is obtained.

The graphene derivative is separated and purified by the same chromatography process as Example 1, and the yield is 46%.

The present example also provides an organic EL device having a similar structure as that of Example 1. The preparation method is almost the same as that of Example 1, except for the preparation of the anode layer.

The graphene derivative of Example 2 is evaporated at a rate of 0.1 nm/s at a temperature of 370° C. to obtain an anode electrode layer having a thickness of 200 nm.

That is to say, the organic EL device of Example 2 has a configuration of polyimide substrate/the graphene derivative of Example 2 (200 nm)/2-TNATA (15 nm)/NPB (60 nm)/TBPe:MADN (2%, 30 nm)/Alq3 (30 nm)/LiF (1 nm)/MgAg (10:1, 100 nm).

The organic EL device of the present example has been measured according to the I-V-L standard test method, and the results thereof are as follows:

Chromaticity coordinates: X=0.15, Y=0.20;

Maximum brightness: 10500 cd/m² (12 V);

Turn-on voltage: 4.0 V; and

Illumination efficiency: 7.5 cd/A.

Example 3

The present example provides a graphene derivative having a similar structure as that of Example 1. The structure of the derivative of Example 3 is as below:

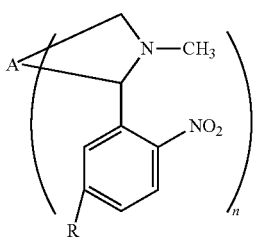

(I-2)

In the structure (I-2), A represents a graphene substrate and n is the total number of the groups connected to the graphene substrate A. The number of carbon atoms of the graphene substrate is between 9000 and 10000, and R is o-tolyl.

The present invention also provides a method of preparing the graphene derivative of Example 3, comprising the following steps.

A powder of monolayer graphene having a particle size of 500 nm is dispersed into toluene. N-methyl glycine and a substituted benzaldehyde are added into the dispersion to form a reaction mixture. The molar ratio of the carbon atoms of the graphene powder, N-methyl glycine and the substituted benzaldehyde is 1:3.5:5.

The structure of the substituted benzaldehyde is shown as below:

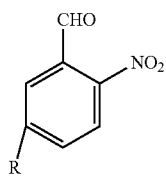

wherein R is o-tolyl.

While being magnetically stirred, the reaction mixture is heated to 90° C. in an oil bath, and maintained at the temperature for 8 h, thereby the graphene derivative of Example 3 is obtained.

The graphene derivative is separated and purified by the same chromatography process as Example 1, and the yield is 52%.

The present example also provides an organic EL device having a similar structure as that of Example 1. The preparation method is almost the same as that of Example 1, except for the preparation of the anode layer.

The graphene derivative of Example 3 is evaporated at a rate of 0.1 nm/s at a temperature of 340° C. to produce an anode electrode layer having a thickness of 50 nm.

That is to say, the organic EL device of Example 3 has a configuration of polyimide substrate/the graphene derivative of Example 3 (50 nm)/2-TNATA (15 nm)/NPB (60 nm)/TBPe:MADN (2%, 30 nm)/Alq3 (30 nm)/LiF (1 nm)/MgAg (10:1, 100 nm).

The organic EL device of the present example has been measured according to the I-V-L standard test method, and the results thereof are as follows:

Chromaticity coordinates: X=0.17, Y=0.21;
Maximum brightness: 10450 cd/m$^2$ (12 V);
Turn-on voltage: 4.1 V; and
Illumination efficiency: 7.2 cd/A.

Example 4

The present example provides a graphene derivative having a similar structure as that of Example 1. The structure of the derivative of Example 4 is as below:

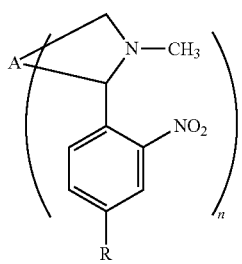

(I-1)

In the structure (I-1), A represents a graphene substrate and n is the total number of the groups connected to the graphene substrate A. The number of carbon atoms of the graphene substrate is between 3000 and 4500, and R is p-tolyl.

The present invention also provides a method of preparing the graphene derivative of Example 4, comprising the following steps.

A powder of monolayer graphene having a particle size of 450 nm is dispersed into tetrahydrofuran in a pressure container. N-methyl glycine and a substituted benzaldehyde are added into the dispersion to form a reaction mixture. The molar ratio of the carbon atoms of the graphene powder, N-methyl glycine and the substituted benzaldehyde is 1:1.5:2.

The structure of the substituted benzaldehyde is shown as below:

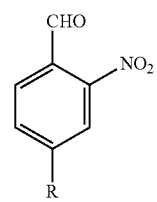

wherein R is p-tolyl.

While being magnetically stirred, the reaction mixture is heated under pressure to 90° C. in an oil bath, and maintained at the temperature for 9 h, thereby the graphene derivative of Example 4 is obtained.

The graphene derivative is separated and purified by the same chromatography process as Example 1, and the yield is 52%.

The present example also provides an organic EL device having a similar structure as that of Example 1. The preparation method is almost the same as that of Example 1, except for the following two aspects:

1) the graphene derivative of Example 4 is evaporated at a rate of 0.1 nm/s at a temperature of 330° C. to produce an anode electrode layer having a thickness of 200 nm; and 2) the material for forming the organic EL layer is CBP doped with 7% of Ir(PPy)$_3$, i.e., CBP:Ir(PPy)$_3$ (7%).

That is to say, the organic EL device of Example 4 has a configuration of polyimide substrate/the graphene derivative of Example 4 (200 nm)/2-TNATA (15 nm)/NPB (60 nm)/CBP:Ir(PPy)$_3$ (7%, 30 nm)/Alq3 (30 nm)/LiF (1 nm)/MgAg (10:1, 100 nm).

The organic EL device of the present example has been measured according to the I-V-L standard test method, and the results thereof are as follows:

Chromaticity coordinates: X=0.32, Y=0.64;
Maximum brightness: 20500 cd/m$^2$ (12 V);
Turn-on voltage: 3.0 V; and
Illumination efficiency: 96 cd/A.

Example 5

The present example provides a graphene derivative having a similar structure as that of Example 1. The structure of the derivative of Example 5 is as below:

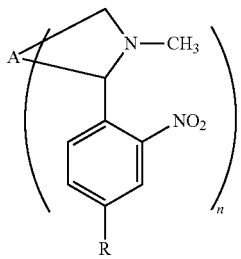

(I-1)

In the structure (I-1), A represents a graphene substrate and n is the total number of the groups connected to the graphene substrate A. The number of carbon atoms of the graphene substrate is between 6000 and 8000, R is $R_1$—$C_6H_5$, and $R_1$ is n-dodecyl.

The present invention also provides a method of preparing the graphene derivative of Example 5, comprising the following steps.

A powder of monolayer graphene having a particle size of 750 nm is dispersed in nitrobenzene. N-methyl glycine and a substituted benzaldehyde are added into the dispersion to form a reaction mixture. The molar ratio of the carbon atoms of the graphene powder, N-methyl glycine and the substituted benzaldehyde is 1:4.5:7.

The structure of the substituted benzaldehyde is shown as below:

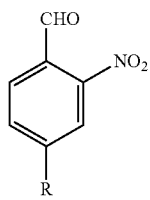

wherein R is $R_1$—$C_6H_5$, and $R_1$ is n-dodecyl.

While being magnetically stirred, the reaction mixture is heated to 130° C. in an oil bath, and maintained at the temperature for 12 h, thereby the graphene derivative of Example 5 is obtained.

The graphene derivative is separated and purified by the same chromatography process as Example 1, and the yield is 50%.

The present example also provides an organic EL device having a similar structure as that of Example 1. The preparation method is almost the same as that of Example 1, except for the following two aspects:

1) the graphene derivative of Example 5 is evaporated at a rate of 0.1 nm/s at a temperature of 350° C. to produce an anode electrode layer having a thickness of 170 nm; and 2) the material for forming the organic EL layer is CBP doped with 7% of Ir(PPy)$_3$, i.e., CBP:Ir(PPy)$_3$ (7%).

That is to say, the organic EL device of Example 5 has a configuration of polyimide substrate/the graphene derivative of Example 5 (170 nm)/2-TNATA (15 nm)/NPB (60 nm)/CBP:Ir(PPy)$_3$ (7%, 30 nm)/Alq3 (30 nm)/LiF (1 nm)/MgAg (10:1, 100 nm).

The organic EL device of the present example has been measured according to the I-V-L standard test method, and the results thereof are as follows:

Chromaticity coordinates: X=0.33, Y=0.63;
Maximum brightness: 18500 cd/m² (12 V);
Turn-on voltage: 3.2 V; and
Illumination efficiency: 94 cd/A.

Example 6

The present example provides a graphene derivative having a similar structure as that of Example 1. The structure of the derivative of Example 6 is as below:

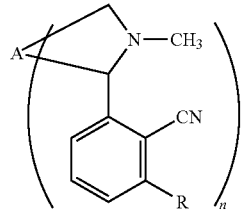

(I-3)

In the structure (I-3), A represents a graphene substrate and n is the total number of the groups connected to the graphene substrate A. The number of carbon atoms of the graphene substrate is between 5000 and 6000, and R is 3-methyl eicosyl.

The present invention also provides a method of preparing the graphene derivative of Example 6, comprising the following steps.

A powder of monolayer graphene having a particle size of 200 nm is dispersed in dichloroethane. N-methyl glycine and a substituted benzaldehyde are added into the dispersion to form a reaction mixture. The molar ratio of the carbon atoms of the graphene powder, N-methyl glycine and the substituted benzaldehyde is 1:3:6.

The structure of the substituted benzaldehyde is shown as below:

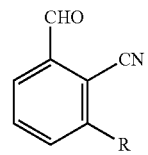

wherein R is 3-methyl eicosyl.

While being magnetically stirred, the reaction mixture is heated to 70° C. in an oil bath, and maintained at the temperature for 10 h, thereby the graphene derivative of Example 6 is obtained.

The graphene derivative is separated and purified by the same chromatography process as Example 1, and the yield is 45%.

The present example also provides an organic EL device having a similar structure as that of Example 1. The preparation method is almost the same as that of Example 1, except for the following two aspects:

1) the graphene derivative of Example 6 is evaporated at a rate of 0.1 nm/s at a temperature of 340° C. to produce an anode electrode layer having a thickness of 50 nm; and 2) the material for forming the organic EL layer is CBP doped with 7% of Ir(PPy)$_3$, i.e., CBP:Ir(PPy)$_3$ (7%).

That is to say, the organic EL device of Example 6 has a configuration of polyimide substrate/the graphene derivative of Example 6 (50 nm)/2-TNATA (15 nm)/NPB (60 nm)/CBP:Ir(PPy)$_3$ (7%, 30 nm)/Alq3 (30 nm)/LiF (1 nm)/MgAg (10:1, 100 nm).

The organic EL device of the present example has been measured according to the I-V-L standard test method, and the results thereof are as follows:
Chromaticity coordinates: X=0.31, Y=0.62;
Maximum brightness: 22300 cd/m² (12 V);
Turn-on voltage: 3.1 V; and
Illumination efficiency: 96 cd/A.

Example 7

The present example provides a graphene derivative having a similar structure as that of Example 1. The structure of the derivative of Example 7 is as below:

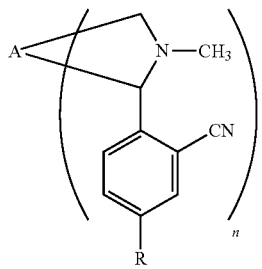

(I-1)

In the structure (I-1), A represents a graphene substrate and n is the total number of the groups connected to the graphene substrate A. The number of carbon atoms of the graphene substrate is between 1500 and 3000, and R is 4-methyl-1-anthryl.

The present invention also provides a method of preparing the graphene derivative of Example 7, comprising the following steps.

A powder of monolayer graphene having a particle size of 500 nm is dispersed in dichloroethane. N-methyl glycine and a substituted benzaldehyde are added into the dispersion to form a reaction mixture. The molar ratio of the carbon atoms of the graphene powder, N-methyl glycine and the substituted benzaldehyde is 1:4:12.

The structure of the substituted benzaldehyde is shown as below:

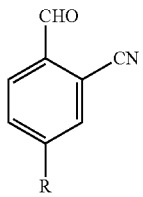

wherein R is 4-methyl-1-anthryl.

While being magnetically stirred, the reaction mixture is heated to 65° C. in an oil bath, and maintained at the temperature for 12 h, thereby the graphene derivative of Example 7 is obtained.

The graphene derivative is separated and purified by the same chromatography process as Example 1, and the yield is 51%.

The present example also provides an organic EL device having a similar structure as that of Example 1. The preparation method is almost the same as that of Example 1, except for the following two aspects:

1) the graphene derivative of Example 7 is evaporated at a rate of 0.1 nm/s at a temperature of 360° C. to produce an anode electrode layer having a thickness of 180 nm; and 2) the material for forming the organic EL layer is Alq3 doped with 1.5% of Rubrene and 3% of DCJTB, i.e., Alq3:Rubrene:DCJTB (1.5%, 3%).

That is to say, the organic EL device of Example 7 has a configuration of polyimide substrate/the graphene derivative of Example 7 (180 nm)/2-TNATA (15 nm)/NPB (60 nm)/Alq3:Rubrene:DCJTB (1.5%, 3%, 30 nm)/Alq3 (30 nm)/LiF (1 nm)/MgAg (10:1, 100 nm).

The organic EL device of the present example has been measured according to the I-V-L standard test method, and the results thereof are as follows:
Chromaticity coordinates: X=0.63, Y=0.34;
Maximum brightness: 10000 cd/m² (12 V);
Turn-on voltage: 4.0 V; and
Illumination efficiency: 8 cd/A.

Example 8

The present example provides a graphene derivative having a similar structure as that of Example 1. The structure of the derivative of Example 8 is as below:

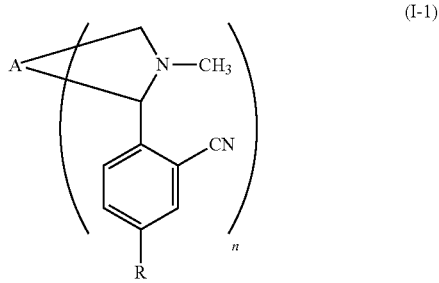

(I-1)

In the structure (I-1), A represents a graphene substrate and n is the total number of the groups connected to the graphene substrate A. The number of carbon atoms of the graphene substrate is between 2000 and 4000, R is —$R_2$—$C_6H_5$, and $R_2$ is 2-ethyl heptyl.

The present invention also provides a method of preparing the graphene derivative of Example 8, comprising the following steps.

A powder of monolayer graphene having a particle size of 1000 nm is dispersed into toluene in a pressure container. N-methyl glycine and a substituted benzaldehyde are added into the dispersion to form a reaction mixture. The molar ratio of the carbon atoms of the graphene powder, N-methyl glycine and the substituted benzaldehyde is 1:1.8:3.

The structure of the substituted benzaldehyde is shown as below:

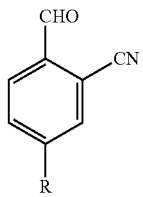

wherein R is —$R_2$—$C_6H_5$, and $R_2$ is 2-ethyl heptyl.

While being magnetically stirred, the reaction mixture is heated under pressure to 150° C. in an oil bath, and maintained at the temperature for 8 h, thereby the graphene derivative of Example 8 is obtained.

The graphene derivative is separated and purified by the same chromatography process as Example 1, and the yield is 55%.

The present example also provides an organic EL device having a similar structure as that of Example 1. The preparation method is almost the same as that of Example 1, except for the following two aspects:

1) the graphene derivative of Example 8 is evaporated at a rate of 0.1 nm/s at a temperature of 370° C. to produce an anode electrode layer having a thickness of 90 nm; and 2) the material for forming the organic EL layer is Alq3 doped with 1.5% of Rubrene and 3% of DCJTB, i.e. Alq3:Rubrene:DCJTB (1.5%, 3%).

That is to say, the organic EL device of Example 8 has a configuration of polyimide substrate/the graphene derivative of Example 8 (90 nm)/2-TNATA (15 nm)/NPB (60 nm)/Alq3:Rubrene:DCJTB (1.5%, 3%, 30 nm)/Alq3 (30 nm)/LiF (1 nm)/MgAg (10:1, 100 nm).

The organic EL device of the present example has been measured according to the I-V-L standard test method, and the results thereof are as follows:

Chromaticity coordinates: X=0.63, Y=0.32;

Maximum brightness: 12000 cd/m² (12 V);

Turn-on voltage: 4.0 V; and

Illumination efficiency: 9 cd/A.

Example 9

The present example provides a graphene derivative having a similar structure as that of Example 1. The structure of the derivative of Example 9 is as below:

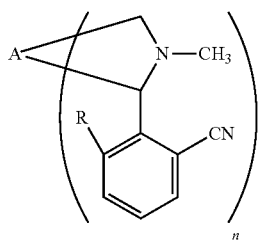

(I-4)

In the structure (I-4), A represents a graphene substrate and n is the total number of the groups connected to the graphene substrate A. The number of carbon atoms of the graphene substrate is between 500 and 1500, and R is 9-phenanthryl.

The present invention also provides a method of preparing the graphene derivative of Example 9, comprising the following steps.

A powder of monolayer graphene having a particle size of 250 nm is dispersed in nitrobenzene. N-methyl glycine and a substituted benzaldehyde are added into the dispersion to form a reaction mixture. The molar ratio of the carbon atoms of the graphene powder, N-methyl glycine and the substituted benzaldehyde is 1:5.5:10.

The structure of the substituted benzaldehyde is shown as below:

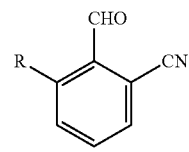

wherein R is 9-phenanthryl.

While being magnetically stirred, the reaction mixture is heated to 60° C. in an oil bath, and maintained at the temperature for 11 h, thereby the graphene derivative of Example 9 is obtained.

The graphene derivative is separated and purified by the same chromatography process as Example 1, and the yield is 48%.

The present example also provides an organic EL device having a similar structure as that of Example 1. The preparation method is almost the same as that of Example 1, except for the following two aspects:

1) the graphene derivative of Example 9 is evaporated at a rate of 0.1 nm/s at a temperature of 330° C. to produce an anode electrode layer having a thickness of 130 nm; and 2) the material for forming the organic EL layer is Alq3 doped with 1.5% of Rubrene and 3% of DCJTB, i.e., Alq3:Rubrene:DCJTB (1.5%, 3%).

That is to say, the organic EL device of Example 9 has a configuration of polyimide substrate/the graphene derivative of Example 9 (130 nm)/2-TNATA (15 nm)/NPB (60 nm)/Alq3:Rubrene:DCJTB (1.5%, 3%, 30 nm)/Alq3 (30 nm)/LiF (1 nm)/MgAg (10:1, 100 nm).

The organic EL device of the present example has been measured according to the I-V-L standard test method, and the results thereof are as follows:

Chromaticity coordinates: X=0.61, Y=0.34;

Maximum brightness: 11590 cd/m² (12 V);

Turn-on voltage: 4.3 V; and

Illumination efficiency: 8.4 cd/A.

Example 10

The present example provides a graphene derivative having a similar structure as that of Example 1. The structure of the derivative of Example 10 is as below:

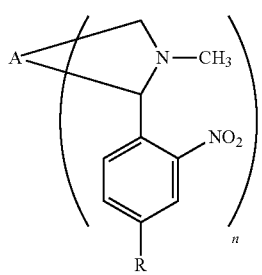

(I-1)

In the structure (I-1), A represents a graphene substrate and n is the total number of the groups connected to the graphene substrate A. The number of carbon atoms of the graphene substrate A is between 8000 and 10000, R is —O—$R_2$, and $R_2$ is 2-methyl hexyl.

The present invention also provides a method of preparing the graphene derivative of Example 10, comprising the following steps.

In a pressure container, a powder of monolayer graphene having a particle size of 730 nm is dispersed in dioxane. N-methyl glycine and a substituted benzaldehyde are added into the dispersion to form a reaction mixture. The molar ratio of the carbon atoms of the graphene powder, N-methyl glycine and the substituted benzaldehyde is 1:3:6.

The structure of the substituted benzaldehyde is shown as below:

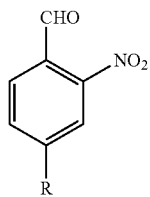

wherein R is —O—$R_2$, and $R_2$ is 2-methyl hexyl.

While being magnetically stirred, the reaction mixture is heated under pressure to 120° C. in an oil bath, and maintained at the temperature for 8.5 h, thereby the graphene derivative of Example 10 is obtained.

The graphene derivative is separated and purified by the same chromatography process as Example 1, and the yield is 49%.

The present example also provides an organic EL device having a similar structure as that of Example 1. The preparation method is almost the same as that of Example 1, except for the preparation of the anode layer.

The graphene derivative of Example 10 is evaporated at a rate of 0.1 nm/s at a temperature of 350° C. to obtain an anode electrode layer having a thickness of 60 nm.

That is to say, the organic EL device of Example 10 has a configuration of polyimide substrate/the graphene derivative of Example 10 (60 nm)/2-TNATA (15 nm)/NPB (60 nm)/TBPe:MADN (2%, 30 nm)/Alq3 (30 nm)/LiF (1 nm)/MgAg (10:1, 100 nm).

The organic EL device of the present example has been measured according to the I-V-L standard test method, and the results thereof are as follows:

Chromaticity coordinates: X=0.16, Y=0.22;
Maximum brightness: 10080 cd/m² (12 V);
Turn-on voltage: 4.3 V; and
Illumination efficiency: 7.0 cd/A.

Comparative Example

This Comparative Example provides an organic EL device having a similar structure as that of Example 1. The preparation method is almost the same as that of Example 1, except for the preparation of the anode layer as described below.

A graphene powder obtained from Sinocarbon Materials Technology Co., Ltd is directly used as the material for preparing the anode layer. The number of the carbon atoms of the graphene powder is between 4000 and 6000. The graphene is evaporated onto the surface of a polyimide substrate at a rate of 0.1 nm/s at a temperature of 420° C. to produce an anode electrode having a thickness of 100 nm.

That is to say, the organic EL device of the Comparative Example has a configuration of polyimide substrate/the graphene (100 nm)/2-TNATA (15 nm)/NPB (60 nm)/TBPe:MADN (2%, 30 nm)/Alq3 (30 nm)/LiF (1 nm)/MgAg (10:1, 100 nm).

The organic EL device of the Comparative Example has been measured according to the I-V-L standard test method, and the results thereof are as follows:

Chromaticity coordinates: X=0.15, Y=0.22;
Maximum brightness: 8500 cd/m² (12 V);
Turn-on voltage: 4.8 V; and
Illumination efficiency: 6 cd/A.

From the Examples described above, it can be seen that the graphene derivatives of the present invention can be evaporated at a temperature ranging from 330 to 370° C., which is significantly lower than the evaporation temperature (400° C. or more) of the existing graphene. As a result, the preparation process of the organic EL device of the present invention is simple and easy to control. In the event that the same organic EL material is adopted, the organic EL device in which the graphene derivative of the present invention is employed exhibits a higher maximum brightness and illumination efficiency, as well as a lower turn-on voltage, as compared with the organic EL device in which the existing graphene is used. It demonstrates that the work function of the graphene derivatives of the present invention greatly matches with that of the organic EL materials, and thus a better light-emitting effect can be achieved.

Apparently, the above-described Examples of the graphene derivatives, the methods of preparing the graphene derivatives, and the organic EL devices of the present invention are provided for the purpose of exemplification and illustration. Those examples are not intended to limit the protection scope of the present invention. Many modifications and variations will be apparent to the practitioners skilled in the art. For example, the group R presented in the graphene derivatives can be in other forms as defined herein. The graphene derivatives may be prepared by other methods, and separated by other techniques. The organic EL devices may have other structures or configurations. For instance, the organic EL devices may have no injection layer or transporting layer, etc. Except for the anode layer, the other layers of the organic EL devices may be prepared by other known materials and other appropriate process parameters. In addition to the above-mentioned graphene derivatives, the anode layer may contain other substances. Moreover, the parameters and processes for preparing the anode layer as well as the thickness of the anode layer may be varied.

It is understood that the present invention is not limited to the above-illustrated embodiments, which were chosen and described in order to best explain the principles of the invention. Those skilled in the art can make various modifications or variations without departing from the spirit and essence of the present invention. It is intended that the scope of the invention be defined by the following claims and their equivalents.

The invention claimed is:

1. A graphene derivative, characterized in that it is represented by the following formula (I):

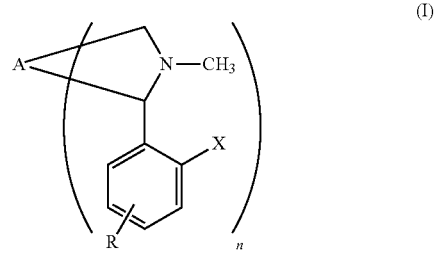

wherein:

A represents a graphene substrate;

n represents the number of the group represented by the following formula (II) and is a positive integer equal to or less than a half (½) of the total number of carbon atoms in the graphene substrate:

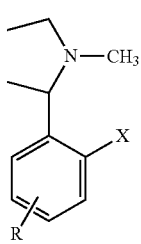

(II)

wherein each group represented by formula (II) is connected to adjacent two carbon atoms of a carbon ring of the graphene substrate, and each carbon atom of the graphene substrate connects with at most one group represented by formula (II);

each X independently represents —NO$_2$ or —CN; and each R independently represents any one of —R$_1$, —R$_2$, —O—R$_1$, —O—R$_2$, —R$_1$—C$_6$H$_5$, —R$_2$—C$_6$H$_5$, and —R$_3$, wherein each R$_1$ is independently an n-alkyl group having no less than 5 carbon atoms, each R$_2$ is independently a substituted n-alkyl group having no less than 5 carbon atoms in its main chain and having an alkyl substituent, the C$_6$H$_5$ represents a phenyl group which is connected to the end of R$_1$ or R$_2$, and R$_3$ is an aryl group.

2. The graphene derivative according to claim 1, characterized in that the number of the carbon atoms of the graphene substrate is between 500 and 10000.

3. The graphene derivative according to claim 1, characterized in that the group represented by formula II is a group represented by the following formula IIa:

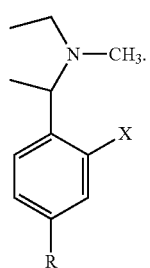

(IIa)

4. The graphene derivative according to claim 1, characterized in that, the number of carbon atoms of R$_1$ ranges from 5 to 20;

the number of carbon atoms in the main chain of R$_2$ ranges from 5 to 20, wherein the alkyl substituent is a methyl or ethyl and is connected to the carbon atom at 2-position or 3-position of the main chain of R$_2$; and the number of ring carbon atoms in R$_3$ ranges from 6 to 24.

5. The graphene derivative according to claim 4, characterized in that,

R$_3$ is one selected from the group consisting of phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-tetracenyl, 2-tetracenyl, 9-tetracenyl, 1-pyrenyl, 2-pyrenyl, 4-pyrenyl, 2-biphenyl, 3-biphenyl, 4-biphenyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-tert-butyl-phenyl, p-(2-phenylpropyl)phenyl, 3-methyl-2-naphthyl, 4-methyl-1-naphthyl, 4-methyl-1-anthryl, 4'-methyl-biphenyl, and 4"-tert-butyl-p-terphenyl-4-yl.

6. A method of preparing a graphene derivative represented by formula (I):

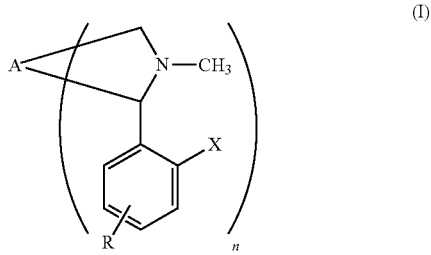

(I)

wherein:

A represents a graphene substrate;

n represents the number of the group represented by the following formula (II) and is a positive integer equal to or less than a half (½) of the total number of carbon atoms in the graphene substrate:

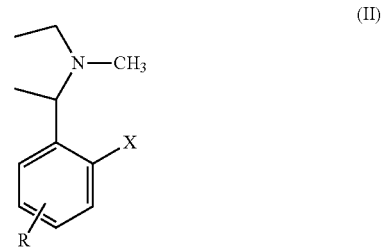

(II)

wherein each group represented by formula (II) is connected to adjacent two carbon atoms of a carbon ring of the graphene substrate, and each carbon atom of the graphene substrate connects with at most one group represented by formula (II);

each X independently represents an electron-withdrawing group; and each R independently represents any one of —R$_1$, —R$_2$, —O—R$_1$, —O—R$_2$, —R$_1$—C$_6$H$_5$, —R$_2$—C$_6$H$_5$, and —R$_3$, wherein each R$_1$ is independently an n-alkyl group having no less than 5 carbon atoms, each R$_2$ is independently a substituted n-alkyl group having no less than 5 carbon atoms in its main chain and having an alkyl substituent, the C$_6$H$_5$ represents a phenyl group which is connected to the end of R$_1$ or R$_2$, and R$_3$ is an aryl group, characterized in that the method comprises the following steps:

dispersing a graphene in a solvent to form a dispersion, and then mixing the dispersion with N-methyl glycine and a substituted benzaldehyde represented by the following formula to form a reaction mixture,

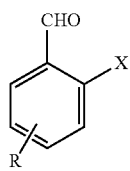

wherein the definitions of R and X are the same as described above with respect to the formula (I), respectively; and heating the reaction mixture to a reaction temperature and maintaining the mixture under the temperature to effect reaction, thereby obtaining the graphene derivative.

7. The method according to claim 6, characterized in that the graphene is a powder of a monolayer graphene having a particle size of 200 nm to 1000 nm.

8. The method according to claim 6, characterized in that the solvent is selected from the group consisting of toluene, dioxane, tetrahydrofuran, nitrobenzene, and dichloroethane.

9. The method according to claim 6, characterized in that the molar ratio of the graphene carbon atoms, N-methyl glycine, and substituted benzaldehyde is 1:(1.5 to 5.5):(2 to 12).

10. The method according to claim 6, characterized in that the reaction mixture is heated to a temperature of 60 to 150° C., and maintained at the temperature for 8 to 20 hours.

11. The method according to claim 6, characterized in that the method further comprises:

separating the graphene derivative from the reaction mixture by a chromatography process.

12. A transparent conductive film, characterized in that the film comprises the graphene derivative according to claim 1.

13. An organic electroluminescent device, including an anode layer, an organic electroluminescent layer, and a cathode layer, characterized in that said anode layer comprises the graphene derivative according to claim 1.

14. A method of preparing an anode layer on a substrate of an organic electroluminescent device, characterized in that:

the graphene derivative according to claim 1 is deposited onto the substrate by a vacuum evaporation at a temperature of 330 to 370° C.

* * * * *